US008519472B2

(12) United States Patent
Jeong et al.

(10) Patent No.: US 8,519,472 B2
(45) Date of Patent: Aug. 27, 2013

(54) SEMICONDUCTOR DEVICE AND METHOD OF FORMING THE SAME

(75) Inventors: Jaehun Jeong, Hwaseong-si (KR); Ju-Young Lim, Seoul (KR); Hansoo Kim, Suwon-si (KR); Jaehoon Jang, Seongnam-si (KR); Sunil Shim, Seoul (KR); Jae-Joo Shim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 210 days.

(21) Appl. No.: 12/831,728

(22) Filed: Jul. 7, 2010

(65) Prior Publication Data

US 2011/0012189 A1 Jan. 20, 2011

(30) Foreign Application Priority Data

Jul. 20, 2009 (KR) ........................ 10-2009-0065966

(51) Int. Cl.
*H01L 29/792* (2006.01)

(52) U.S. Cl.
USPC .................... 257/326; 257/324; 257/E29.309

(58) Field of Classification Search
None
See application file for complete search history.

(56) References Cited

U.S. PATENT DOCUMENTS

| | | | | |
|---|---|---|---|---|
| 7,315,059 | B2 * | 1/2008 | Endoh et al. | 257/324 |
| 7,696,559 | B2 | 4/2010 | Arai et al. | |
| 8,063,438 | B2 * | 11/2011 | Son et al. | 257/328 |
| 2002/0154556 | A1 * | 10/2002 | Endoh et al. | 365/200 |
| 2003/0157763 | A1 * | 8/2003 | Endoh et al. | 438/201 |
| 2006/0244044 | A1 * | 11/2006 | Reinberg | 257/315 |
| 2007/0158736 | A1 | 7/2007 | Arai et al. | |
| 2008/0179659 | A1 | 7/2008 | Enda et al. | |
| 2009/0001419 | A1 | 1/2009 | Han et al. | |
| 2010/0078701 | A1 * | 4/2010 | Shim et al. | 257/314 |
| 2010/0080065 | A1 * | 4/2010 | Fujiki et al. | 365/185.19 |
| 2010/0159657 | A1 | 6/2010 | Arai et al. | |

FOREIGN PATENT DOCUMENTS

| | | |
|---|---|---|
| JP | 2007-180389 | 7/2007 |
| KR | 10-2008-0070583 | 7/2008 |
| KR | 10-0855990 | 8/2008 |

* cited by examiner

*Primary Examiner* — Hoang-Quan Ho
(74) *Attorney, Agent, or Firm* — Onello & Mello, LLP

(57) ABSTRACT

A semiconductor device includes stacked-gate structures including a plurality of cell gate patterns and insulating patterns alternately stacked on a semiconductor substrate and extending in a first direction. Active patterns and gate dielectric patterns are disposed in the stacked-gate structures. The active patterns penetrate the stacked-gate structures and are spaced apart from each other in a second direction intersecting the first direction, and the gate dielectric patterns are interposed between the cell gate patterns and the active patterns and extend onto upper and lower surfaces of the cell gate patterns. The active patterns share the cell gate patterns in the stacked-gate structures.

20 Claims, 16 Drawing Sheets

122
121
125
120
100
GL
102
121
GL
118
GL
121
GL
102
119
122
121
114
125
120
114
114
114
112

122
SSG
121
CG
125
120
CG
GSG
100
124
102
121
119
118
121
123
124
102
119
122
121
114
125
120
114
114
114
112

122
121
120
100
123
102
121
121
123
102
119
122
121
117
114
115
120
114
115
114
115
114
113
112

122
SSGa
121
CG
125b
120
CG
GSG
100
102
124
121
128
123
119
114
125b
120
112

SEMICONDUCTOR DEVICE AND METHOD OF FORMING THE SAME

CROSS-REFERENCE TO RELATED APPLICATIONS

This U.S. non-provisional patent application claims priority under 35 U.S.C. §119 of Korean Patent Application 10-2009-0065966, filed in the Korean Intellectual Property Office on Jul. 20, 2009, the entire contents of which are hereby incorporated by reference.

BACKGROUND

1. Field

The present inventive concept relates to a semiconductor device and a method of forming the same.

2. Related Art

With the increasing demand for large-capacity, multi-function, and/or compactness of electronic devices and systems, various techniques have been introduced to highly integrate memory devices to be used therein. For high integration of memory devices, increasingly finer patterns forming the devices have been developed. In order to form the fine patterns, however, expensive equipment is required. Furthermore, although expensive equipment is used, it is often not possible to realize the finer patterns as desired. As alternatives for overcoming these problems, accordingly, developments have been actively made on techniques for the high integration of semiconductor devices.

SUMMARY

The inventive concept provides a semiconductor device optimized for high integration.

The inventive concept also provides a semiconductor device in which reliability is improved.

According to one aspect, the inventive concept is directed to a semiconductor device including: a stacked-gate structure including a plurality of cell gate patterns and insulating patterns alternately stacked on a semiconductor substrate and extending in a first direction; active patterns penetrating the stacked-gate structure and being spaced apart from each other in a second direction intersecting the first direction; and gate dielectric patterns interposed between the cell gate patterns and the active patterns and extending onto upper and lower surfaces of the cell gate patterns. In this case, the active patterns in the second direction share the cell gate patterns in the stacked-gate structure.

In some embodiments, the stacked-gate structure may further include a pair of upper selection gate patterns extending in the first direction on an uppermost cell gate pattern. The pair of upper selection gate patterns may be disposed so as to be spaced apart from each other in the second direction. In some embodiments, one active pattern penetrates one upper selection gate pattern in the second direction.

In some embodiments, a plurality of the active patterns are arranged along the first direction in the one upper selection gate pattern.

In some embodiments, the stacked-gate structure may further include a pair of lower selection gate patterns extending in the first direction between a lowermost cell gate pattern and the semiconductor substrate. The pair of lower selection gate patterns may be disposed so as to be spaced apart from each other in the second direction.

In some embodiments, the semiconductor device may further include another stacked-gate structure spaced apart from the stacked-gate structure in the second direction. In this case, an interval between the pair of upper selection gate patterns in one stacked gate structure may be narrower than an interval between the stacked-gate structures.

In some embodiments, the semiconductor device may further include common source regions in the substrate between the stacked-gate structures.

In some embodiments, the active patterns may penetrate the pair of upper selection gate patterns and may be arranged along the first direction.

In some embodiments, the gate dielectric patterns may extend onto opposing sidewalls of the pair of upper selection gate patterns.

In some embodiments, sidewalls of the stacked-gate structures may make an angle larger than 0° with a normal line of an upper surface of the substrate.

In some embodiments, an angle between the sidewalls of the pair of upper selection gate patterns and the normal line of the upper surface of the substrate may be smaller than an angle between the sidewalls of the stacked-gate structures and the normal line of the upper surface of the substrate.

In some embodiments, the gate dielectric patterns may include an oxide layer-nitride-layer-oxynitride layer.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to describe principles of the inventive concept.

DETAILED DESCRIPTION OF THE EMBODIMENTS

A semiconductor device according to embodiments of the inventive concept will be described below with reference to the accompanying drawings. The exemplary embodiments of the inventive concept may, however, be embodied in many different forms and should not be construed as being limited to the embodiments set forth herein. Rather, these embodiments are provided so that this disclosure will be thorough and complete and will fully convey the scope of the inventive concept to those skilled in the art, and the embodiments of the inventive concept will only be defined by the appended claims.

As used herein, the terms "and/or" is intended to include any and all combinations of one or more of the associated listed items. It will be understood that when an element or layer is referred to as being "on" another element or layer, it may be directly on the other element or layer or intervening elements or layers may be present. It will be understood that, although the terms first, second, third, etc. may be used herein to clearly describe various elements, components, regions, layers, and/or sections, these elements, components, regions, layers, and/or sections should not be limited by these terms. It will be understood that, although the terms upper, lower, etc. may be used herein to clearly describe various elements, components, regions, layers, and/or sections, these elements, components, regions, layers, and/or sections should not be limited by these terms. In drawings, the thickness and relative thickness of layers and regions is exaggerated to effectively describe technical details.

Figure 1:
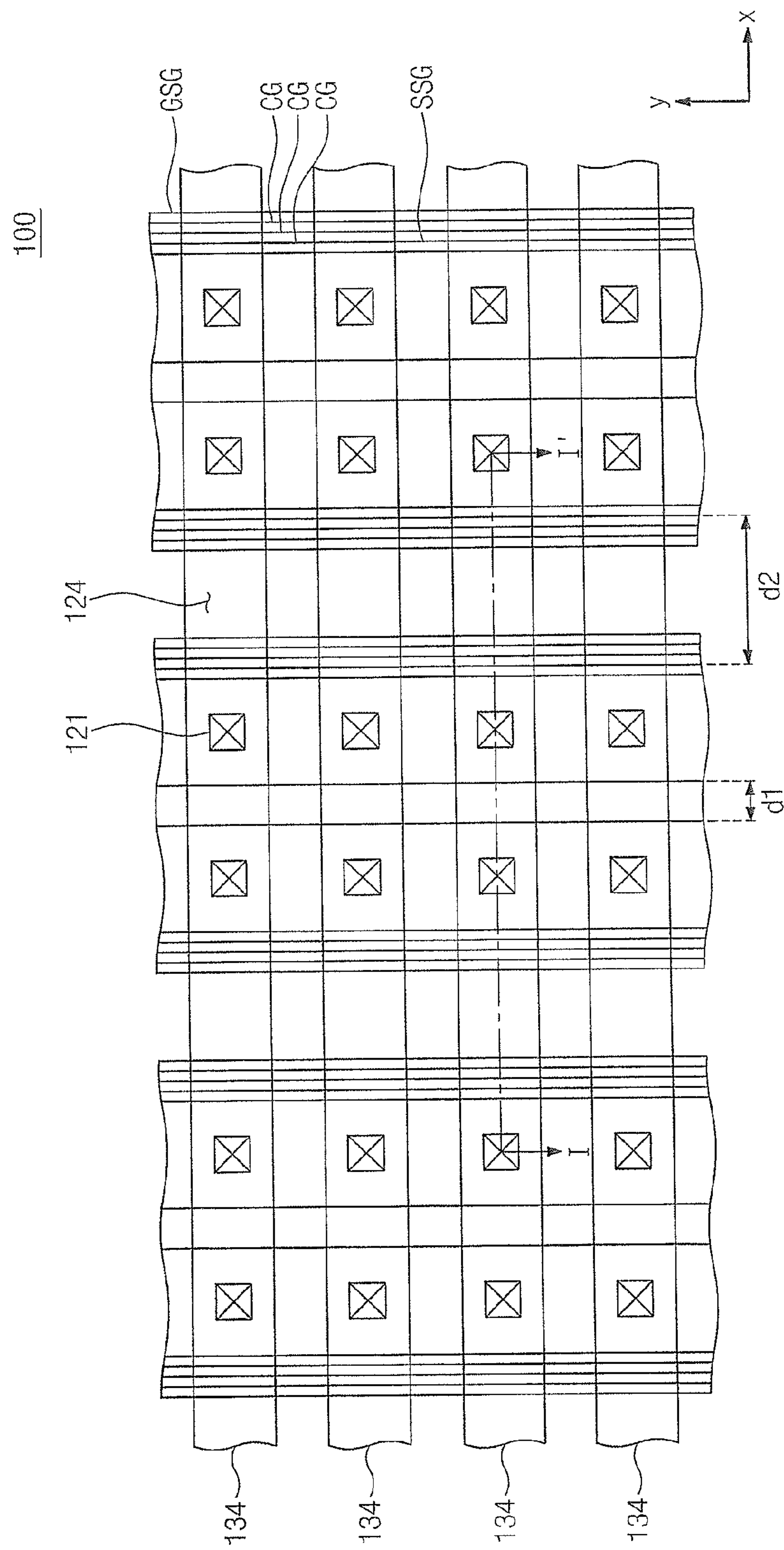
FIG. 1 is a plane view illustrating semiconductor devices according to embodiments of the present inventive concept.

A semiconductor device according to one embodiment of the present inventive concept will be described with reference to FIGS. 1 and 2F. FIG. 1 is a plane view of a cell region in the semiconductor device according to one embodiment of the present inventive concept. FIG. 2F is a sectional view of the semiconductor device taken along the line I-I' illustrated in FIG. 1.

Referring to FIGS. 1 and 2F, a semiconductor substrate (hereinafter, referred to as a 'substrate') 100 is provided. The substrate 100 may include a well region doped with a first conductive dopant. The well region may be provided in the substrate 100 of the cell region.

Stacked-gate structures may be disposed on the substrate 100. The stacked-gate structures may be a line form extending along a first direction on the substrate 100. The stacked-gate structures may be arranged along a second direction on the substrate 100. The second direction may intersect with the first direction.

The stacked-gate structures may include cell gate patterns CGs, upper and lower selection gate patterns SSG and GSG, respectively, inter-gate insulating patterns 114, a base insulating pattern 112, and an upper insulating pattern 119.

The cell gate patterns CGs and the inter-gate insulating patterns 114 may alternately be stacked on the substrate 100. The cell gate patterns CGs may be a line form extending along the first direction on the substrate 100. The cell gate patterns CGs may contain conductive materials. The cell gate patterns CGs may contain doped semiconductors, metals, or conduvtive metal compounds. The inter-gate insulating patterns 114 may be disposed between the cell gate patterns CGS, on the uppermost cell gate pattern CG, and below the lowermost cell gate pattern CG, respectively.

The lower selection gate pattern GSG may be interposed between the substrate 100 and the lowermost cell gate pattern CG. The lower selection gate pattern GSG may include the same material as that of the cell gate patterns CGs. The base insulating pattern 112 may be interposed between the lower selection gate pattern GSG and the substrate 100. In one embodiment of the present inventive concept, the base insulating pattern 112 may be formed to be relatively thin. For instance, the base insulating pattern 112 may be interposed between the lower selection gate pattern GSG and the substrate 100 at a sufficiently thin thickness such that the potential is generated between the substrate 100 and the lower selection gate pattern GSG during operation of the device.

The upper selection gate pattern SSGs may be disposed on the uppermost cell gate CG. The upper insulating pattern 119 may be disposed on the upper selection gate pattern SSG.

Widths of the insulating patterns 112, 114, and 119, which form one stacked-gate structure, may become narrower in proportion to a distance between the substrate 100 and the insulating patterns 112, 114, and 119. For instance, the base insulating pattern 112 closest to the substrate 100 has the broadest width, whereas the upper insulating pattern 119 furthest from the substrate 100 has the narrowest width. In addition, sidewalls of the insulating patterns 112, 114, and 119 may make an acute angle with the lower surfaces of the insulating patterns 112, 114, and 119.

Similar to the insulating patterns 112, 114, and 119, widths of the gate patterns GSG, CG, and SSG may become narrower in proportion to a distance between the substrate 100 and the gate patterns GSG, CG, and SSG. Sidewalls of the gate patterns GSG, CG, and SSG may make an acute angle with the lower surfaces of the gate patterns GSG, CG, and SSG. The sidewall of the stacked-gate structure may make an angle larger than 0° with the normal line of the upper surface of the substrate 100 due to the widths of the insulating patterns 114 and the gate patterns GSG, CG, and SSG. That is, the stacked-gate structure may have an inclined sidewall. For this reason, the distance between the sidewalls of the stacked-gate structures adjacent to each other may broaden as the sidewalls are more distant from the substrate 100. The maximum distance d2 between the adjacent stacked-gate structures may be longer as the number of layers of the stacked gate patterns and the insulating patterns increases. The space between the adjacent stacked-gate structures may be filled with an inter-gate structure insulating pattern 124.

One stacked-gate structure may include the plural upper selection gate patterns SSGs. For instance, one stacked-gate structure may include a pair of upper selection gate patterns SSGs separated from each other. The pair of upper selection gate patterns SSGs may be disposed on the uppermost cell gate pattern CG and apart from each other. An inter-upper selection gate insulating pattern 118 may be interposed between the pair of upper selection gate patterns SSGs. The distance d1 between the pair of upper selection gate patterns SSGs may be shorter than the maximum distance d2 between the adjacent stacked-gate structures. The opposing sidewalls of the pair of upper selection gate patterns SSGs may correspond to the normal line of the upper surface of the substrate 100. Alternatively, the angles between the opposing sidewalls of the pair of upper selection gate patterns SGSs and the normal line of the upper surface of the substrate 100 are larger than 0°, but may be smaller than that between the normal line of the upper surface of the substrate 100 and the sidewall of the stacked-gate structure.

Active patterns 121 may penetrate one stacked-gate structure. The active patterns 121 may form a matrix having row and column of the first direction and the second direction in the stacked-gate structure. In the stacked-gate structure, according to one embodiment of the present inventive concept, two active patterns 121 may be disposed in the second direction.

The active pattern 121 may be disposed in a hole 120 penetrating the stacked-gate structure. The hole 120 may have a sidewall inclined to the upper surface of the substrate 100. The upper width of the hole 120 may be larger than the lower width of the hole 120. The active pattern 121 fills the hole 120 and extends upwardly along the sidewalls of the gate patterns GSG, CG, and SSG and the insulating patterns 112, 114, and 118. The lower surface of the active pattern 121 may come in contact with the well region of the substrate 100. Alternatively to the semiconductor device illustrated in drawings, the active pattern 121 covers the sidewall of the hole 120, but may not completely fill the hole 120. For example, the active pattern 121 may be a hollow pillar. The hollow pillar covered by the active pattern may be filled with insulating materials.

The active pattern 121 may include at least one of semiconductor materials including Group 4A elements. For example, the active pattern 121 includes single crystal semiconductor or poly semiconductor. The active pattern 121 may contain undoped semiconductor materials. Alternatively, the active pattern 121 may contain semiconductor materials doped with the first conductive dopant.

A dopant region 122 may be disposed in the uppermost part of the active pattern 121. The dopant region 122 may be a drain region of the cell string. The dopant region 122 may be doped with a second conductive dopant different from the first conductive dopant.

Another stacked-gate structure may be disposed on the substrate 100 adjacent to the stacked-gate structure described above. This other stacked-gate structure may be adjacent the stcked-gate structure in the second direction. A common source region 102 may be disposed between the adjacent two stacked-gate structures. The edge of the common source region 102 may extend into the substrate 100 below the stacked-gate structure. According to one embodiment of the present inventive concept, the common source regions 102 may be disposed at both ends of the stacked-gate structure. The common source region 102 may be doped with the second conductive dopant.

Gate dielectric patterns 125 may be disposed between the gate patterns GSG, CG, and SSG and the active pattern 121. The gate dielectric patterns 125 may extend onto the upper surface and the lower surface of the gate patterns GSG, CG, and SSG.

The gate dielectric pattern 125 may further extend onto the opposing sidewalls of the pair of upper selection gate patterns SSGs. The gate dielectric pattern 125 may come in contact with the inter-upper selection gate insulating pattern 118. In addition, the gate dielectric pattern 125 may extend onto the sidewalls of the insulating patterns 112, 114, and 119 forming the sidewalls of the stacked-gate structure.

Figure 3A:
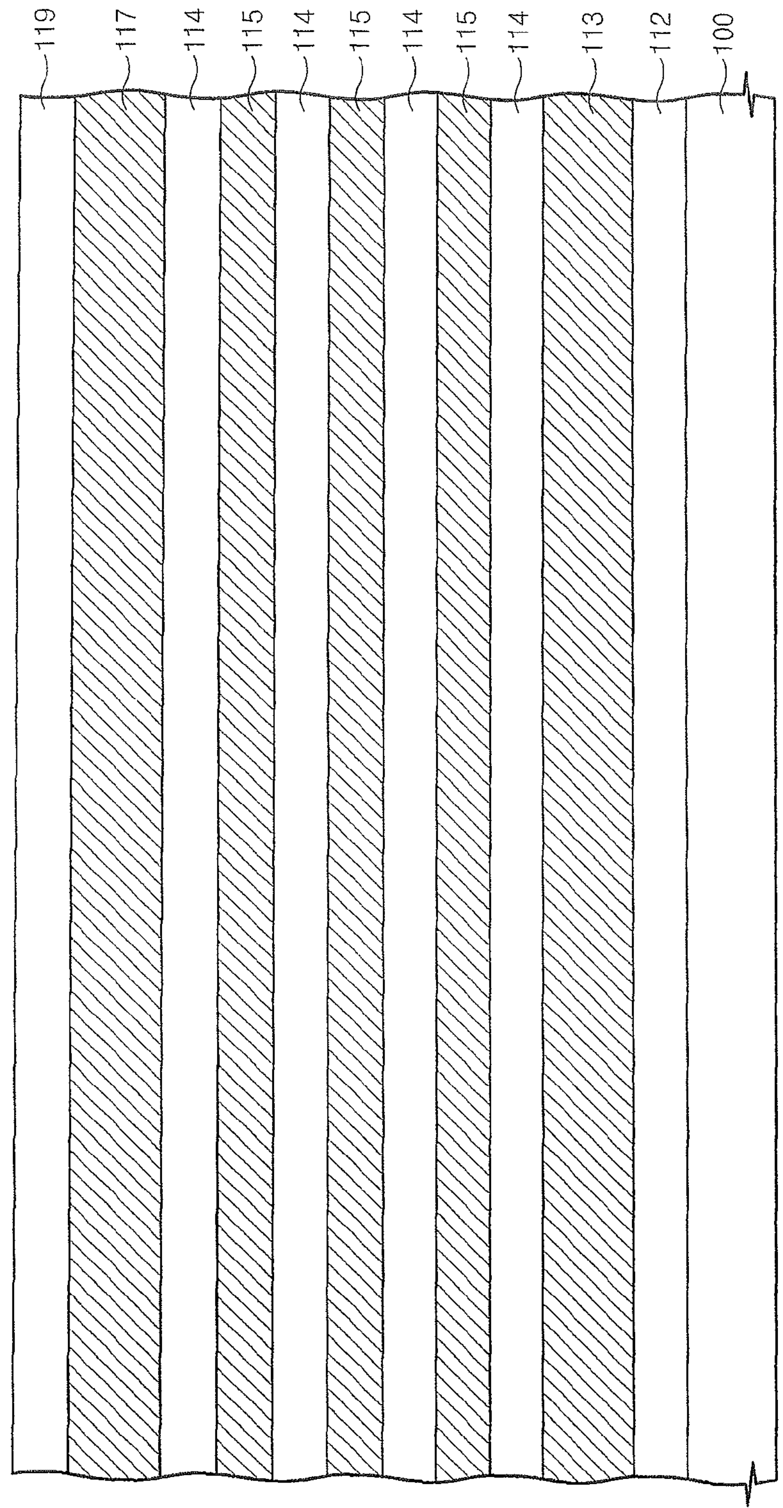
FIGS. 3A through 3E are sectional views illustrating a method of forming a semiconductor device according to another embodiment of the inventive concept.
Figure 3B:
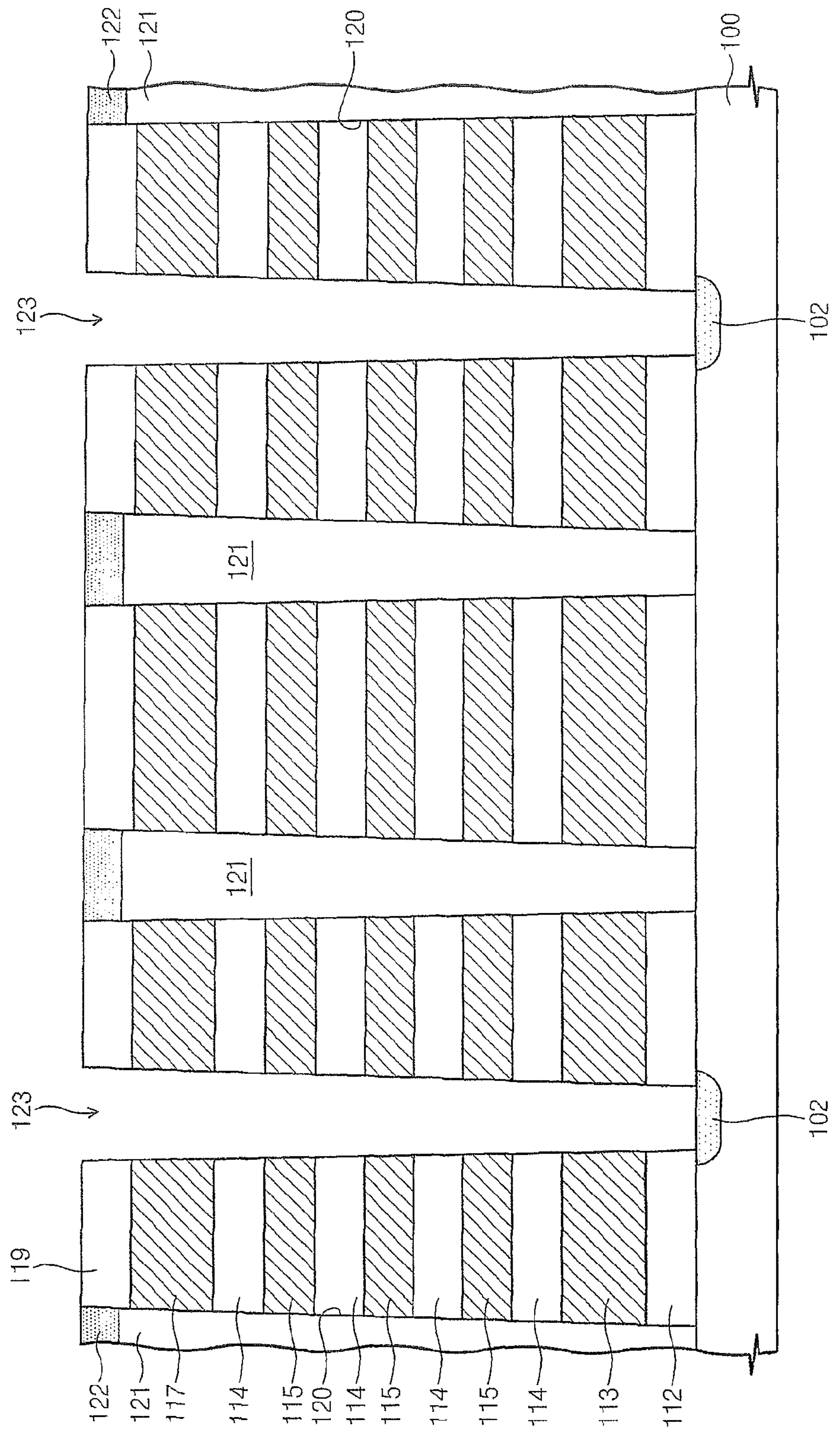
Figure 3C:
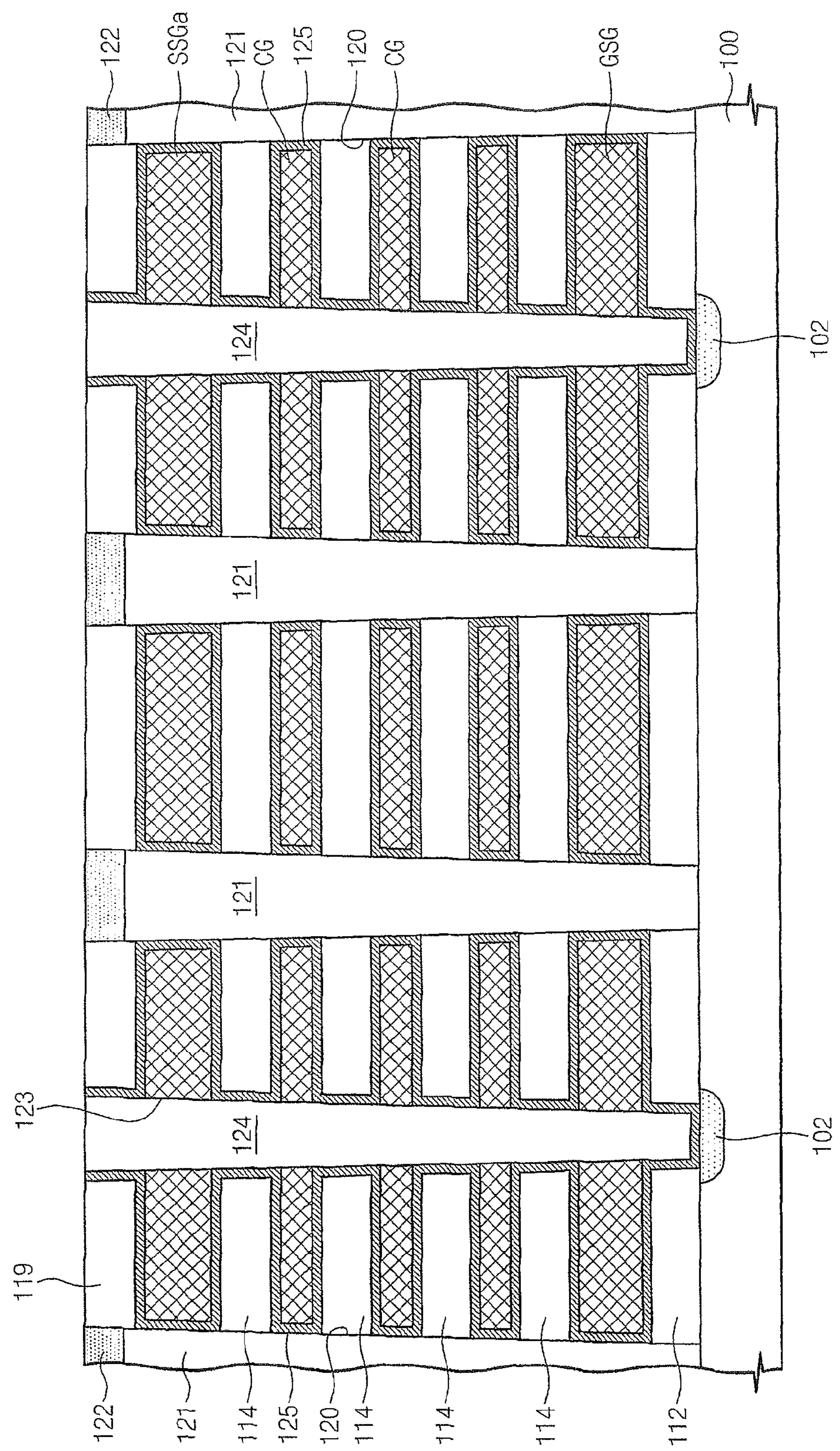
Figure 3D:
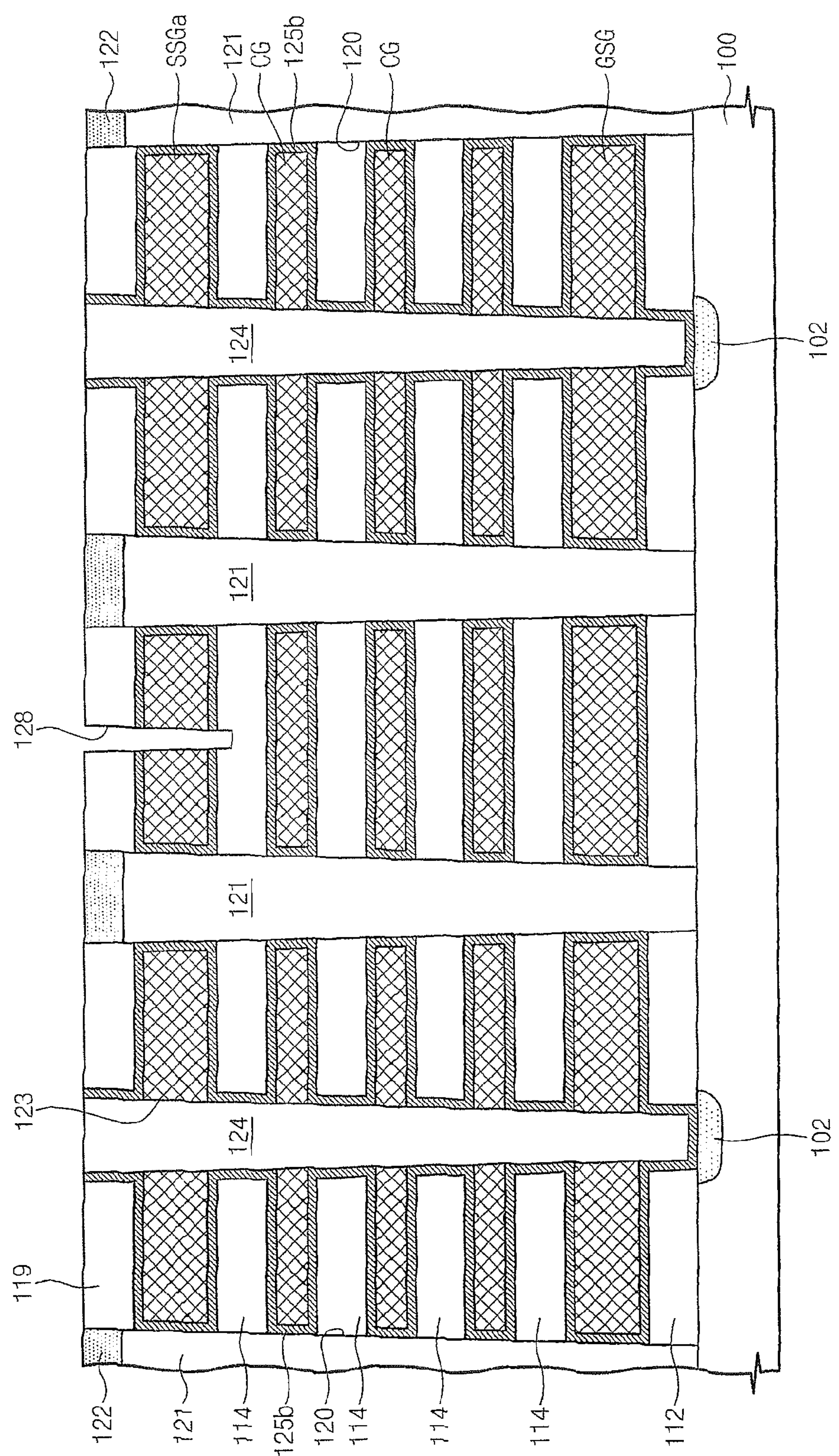
Figure 3E:
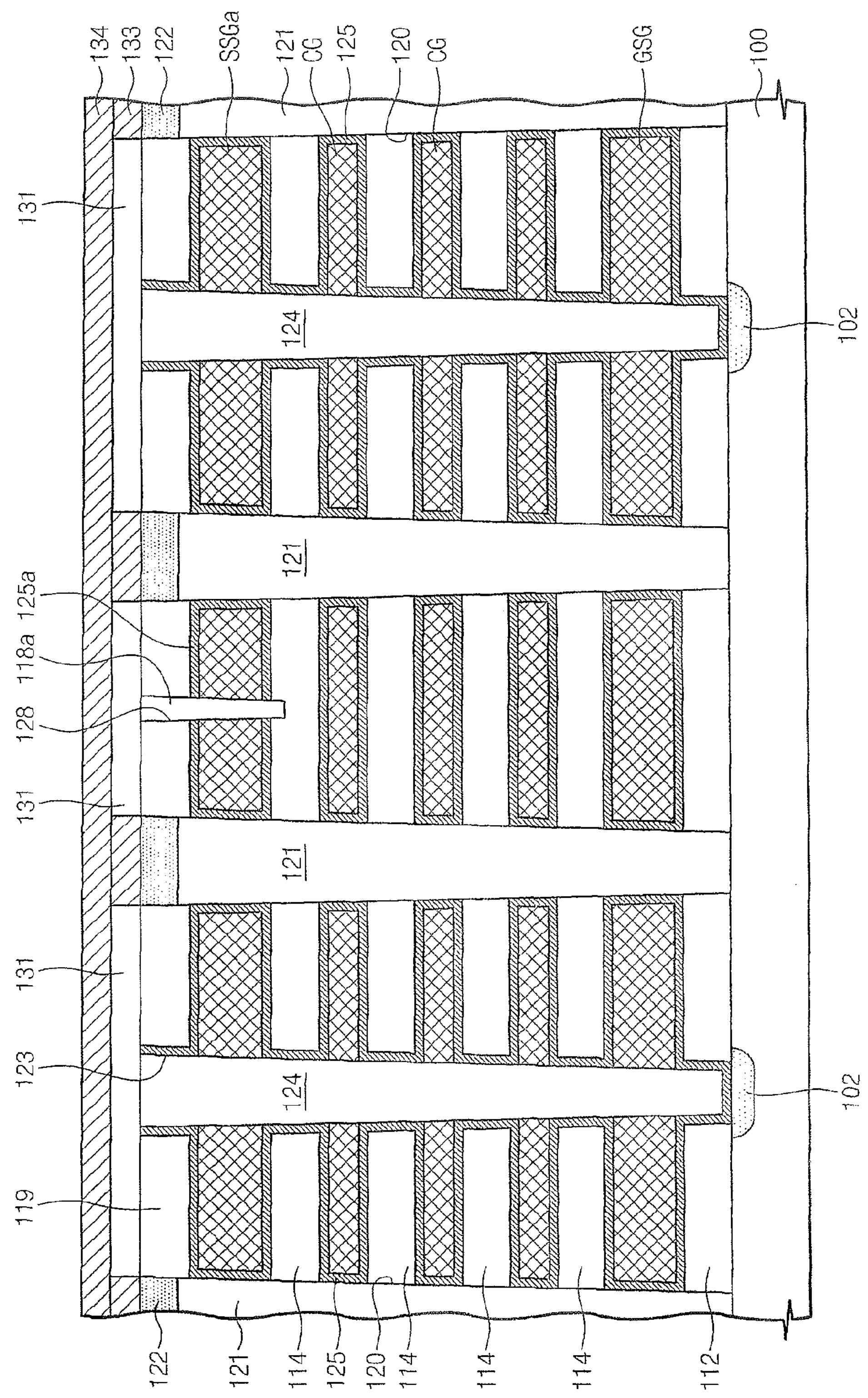

Referring to FIG. 3E, in contrast, the gate dielectric pattern 125 may not extend onto the sidewalls of the pair of upper selection gate patterns SSGs. In this case, the sidewalls of the pair of upper selection gate patterns SSGs may come in contact with an inter-upper selection gate insulating pattern 118*a* and the inter-gate structure insulating pattern 124.

A bitline 134 may be provided on the active pattern 121. The bitline 134 may electrically be connected to the dopant region 122 through a bitline contact 133. The bitline contact 133 may penetrate an interlayer insulating pattern 131 on the stacked-gate structure. The bitline 134 may extend in the second direction. One bitline 134 may electrically be connected to the plurality of active patterns 121 arranged along the second direction.

According to this embodiment of the present inventive concept, it is possible to provide the semiconductor device that is more improved in reliability and optimized for high integration. Specifically, when all of the active patterns within the cell region share one stacked-gate structure, the interference between adjacent cells deeply increases to cause errors in reading operation and/or writing operation. According to this embodiment of the present inventive concept, however, since all of the active patterns within the cell region are not disposed in one stacked-gate structure, the operation errors caused by the interference between adjacent cells may significantly be reduced. Furthermore, as described above, the distance d1 between the pair of upper selection gate patterns in one stacked-gate structure may be shorter than the distance d2 between the stacked-gate structures. According to this embodiment of the present inventive concept, cells adjacent to each other in the second direction are disposed in one stacked-gate structure. Moreover, the cells adjacent to each other in the second direction are connected to the pair of upper selection gate patterns SSGs, which are separated from each other, to form a plurality of cell strings. That is, the cells adjacent to each other in the second direction may be separated into special cells by the separated upper selection gate pattern SSG. Accordingly, it is possible to provide the semiconductor device that is suitable to the high integration.

A semiconductor device according to another embodiment of the present inventive will now be described with reference to FIGS. 1 and 4B. FIG. 4B is a sectional view of the semiconductor device taken along the line I-I' illustrated in FIG. 1. In the semiconductor device illustrated in FIG. 4B, the detailed description will be omitted except for components different from those of the semiconductor device illustrated in FIG. 2F.

Referring to FIG. 4B, one stacked-gate structure may include a plurality of lower selection gate patterns GSGa spaced apart in the second direction from one another. For instance, one stacked-gate structure may include a pair of lower selection gate patterns GSGa extending in the first direction. An inter-lower selection gate insulating pattern 114*a* may be interposed between the pair of lower selection gate patterns GSGa. The gate dielectric pattern 125 may be disposed on the upper surface, lower surface, and outer sidewalls of the lower selection gate pattern GSGa. In addition, the gate dielectric pattern 125 surrounding the pair of lower selection gate patterns GSGa may extend onto an inner sidewall of the lower selection gate pattern adjacent to the active pattern 121.

In one stacked-gate structure, the pair of lower selection gate patterns SGSs adjacent to each other in the second direction may be included in different cell strings, respectively. As a result, the semiconductor device may reduce the error in the reading operation caused by the interference between the cells included in the adjacent cell string.

An example of a method of forming the semiconductor device according to one embodiment of the present inventive concept will now be described with reference to FIGS. 1 and 2A through 2F. FIGS. 2A through 2F are sectional views of the semiconductor device taken along the line I-I' illustrated in FIG. 1. With respect to the components described with reference to FIGS. 1 and 2F, detailed description of those components will not be repeated.

Figure 2A:
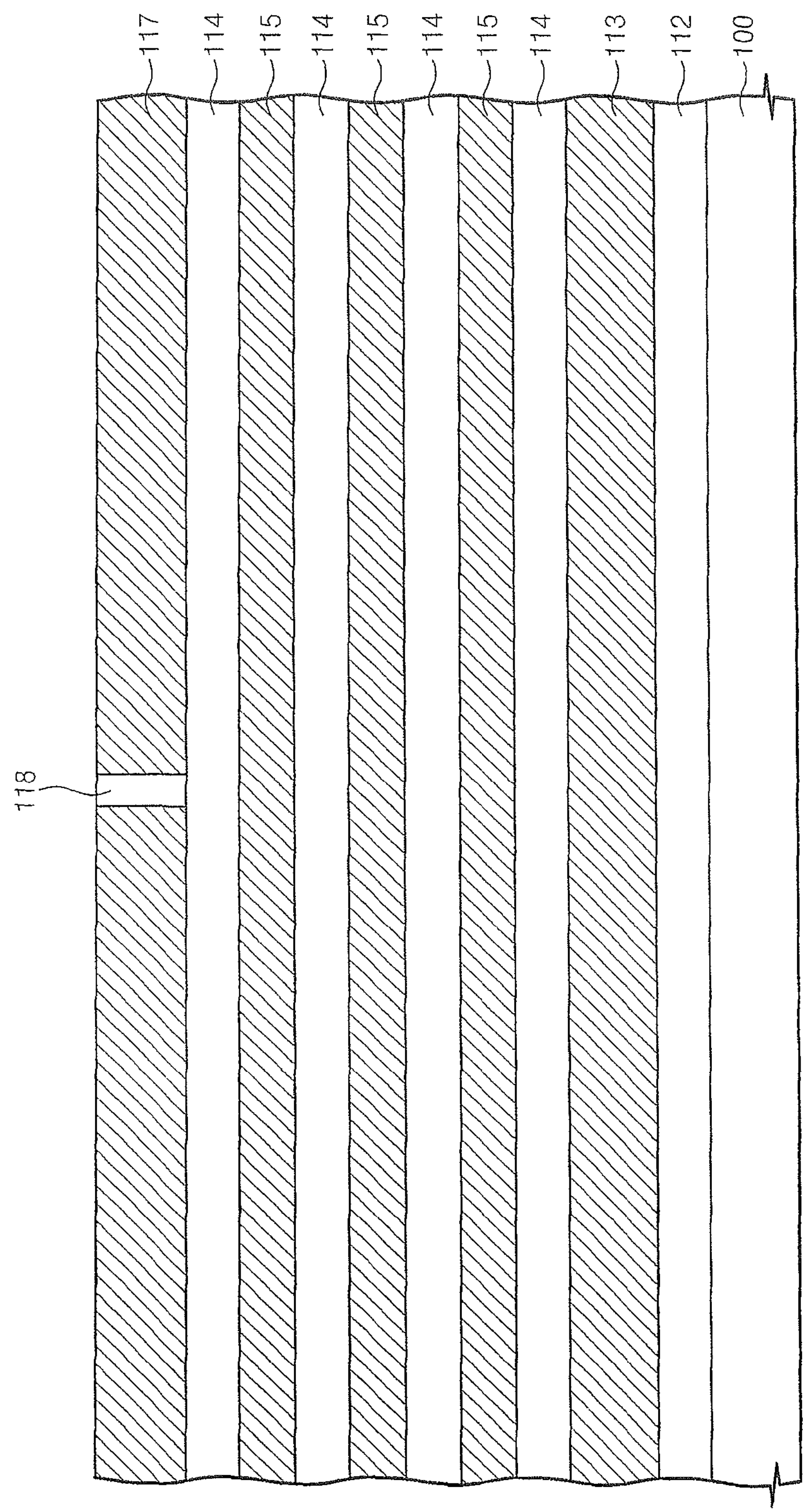
FIGS. 2A through 2F are sectional views illustrating a method of forming a semiconductor device according to one embodiment of the inventive concept.

Referring to FIG. 2A, insulating layers 112 and 114 and sacrificial layers 113, 115, and 117 are alternately formed on the substrate 100. The insulating layers 112 and 114 and the sacrificial layers 113, 115, and 117 may include materials having different etch selectivity, respectively. For instance, the insulating layers 112 and 114 include an oxide of a semiconductor element, and the sacrificial layer 113 contains a nitride of a semiconductor element. The uppermost and lowermost sacrificial layers 113 and 117 may be thick compared to the sacrificial layers interposed therebetween. The thicknesses of the sacrificial layers 115 interposed between the uppermost and lowermost sacrificial layers 113 and 117 may be uniform.

The uppermost sacrificial layer 117 may be separated into a plurality of layers by an anisotropic etching. The space between the separated uppermost sacrificial layers 117 may be in a slit form extending in the first direction. The interval between the separated uppermost sacrificial layers 117 may be "d1−2a". Here, the symbol "d1" means the distance between the upper selection gate patterns that will be described later, and the symbol "a" means the thickness of the gate dielectric pattern that will be described later. The inter-upper selection gate insulating pattern 118 may be formed between the separated uppermost sacrificial layers 117.

Figure 2B:
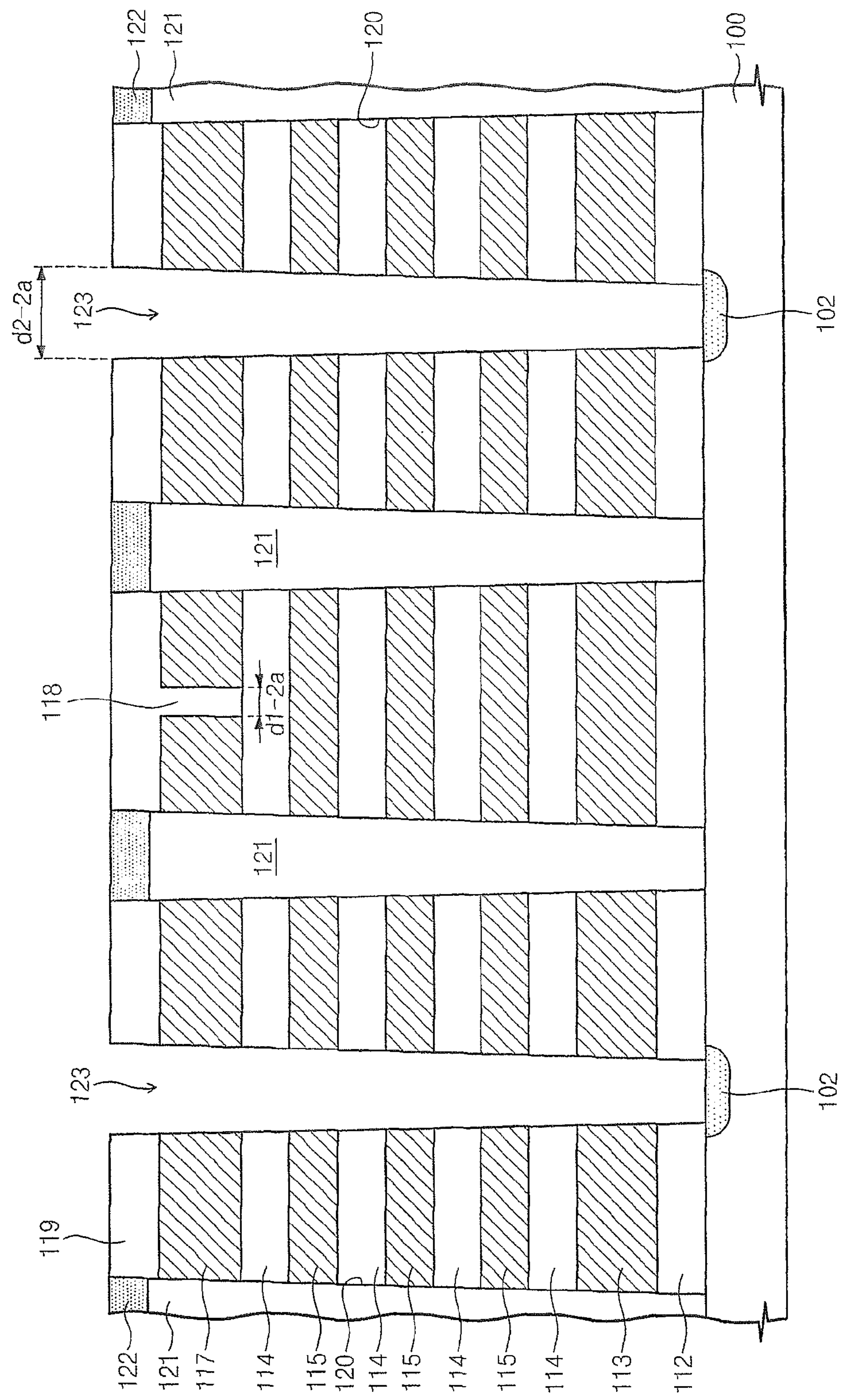

Referring to FIG. 2B, an upper insulating layer 119 may be formed on the separated sacrificial layers 117 and the inter-upper selection gate insulating pattern 118. The upper insulating layer 119 may be formed together with the inter-upper selection gate insulating pattern 118 or may be formed by separate processes with a process forming the inter-upper selection gate insulating pattern 118. The inter-upper selection gate insulating pattern 118 and the upper insulating layer 119 may include the same material as that of the insulating layers 112 and 114.

Alternatively, the inter-upper selection gate insulating pattern 118, the upper insulating layer 119, and the insulating layers 112 and 114 may include different materials, respectively.

Holes 120 may be formed on the substrate 100 to penetrate the insulating layers 112, 114, and 119 and the sacrificial layers 113, 115, and 117. The holes 120 may form a pair of column arranged along the first direction. The holes 120 may expose the upper surface of the substrate 100. The holes 120 may have sidewalls defined by sidewalls of the insulating layers 112, 114, and 119 and the sacrificial layers 113, 115, and 117.

Active patterns 121 may be formed in the holes 120. The lower surfaces of the active patterns 121 may come in contact with the well region of the substrate 100. The active patterns 121 may fill the holes 120. The active patterns may be a pillar form that penetrates the insulating layers 112, 114, and 119 and the sacrificial layers 113, 115, and 117. Alternatively, the active patterns 121 may conformally be formed on the sidewalls of the holes 120 and the upper surface of the substrate 100. The active patterns may be in a form of unfilled column. The upper surfaces of the active patterns 121 may be planarized, thereby exposing the upper surfaces of the upper insulating layers 119.

Dopant regions 122 may be formed in the uppermost parts of the active patterns 121. The dopant regions 122 may be formed by an ion implantation. On the contrary, the dopant regions 122 may be also formed by an in-situ process.

Preliminary stacked-gate structures are formed by patterning the insulating layers 112, 114, and 119 and the sacrificial layers 113, 115, and 117. A groove 123 is formed between the preliminary stacked-gate structures to expose the upper surface of the substrate 100. The groove 123 may extend along the first direction. The sidewalls of the insulating layers 112, 114, and 119 and the sacrificial layers 113, 115, and 117 may be exposed through the groove 123. The sidewalls of the insulating layers 112, 114, and 119 and the sacrificial layers 113, 115, and 117 may be the sidewalls of the preliminary stacked-gate structures.

The sidewalls of the preliminary stacked-gate structures may not be exactly vertical to the upper surface of the substrate 100. For instance, the upper width of the groove 123 may be larger than the lower width of the groove 123. As the total height of the insulating layers 112, 114, and 119 and the sacrificial layers 113, 115, and 117 becomes higher, the difference between the upper width and the lower width of the groove may become larger.

The maximum width "d2−2a" of the groove 123 may be larger than the interval "d1−2a" between the separated uppermost sacrificial layers 117. This reason is because the height of the uppermost sacrificial layer 117 from the substrate 100 is different from that of the insulating layers 112, 114, and 119 and the sacrificial layers 113, 115, and 117. Specifically, as the heights of the layers to be etched become higher, the sidewalls of the etched layer may be more inclined from an upper surface of the substrate 100. In addition, the level inclined from the substrate may be increased when the layers formed of different kinds of materials are etched.

The substrate 100 exposed through the groove 123 may be doped with dopants, and a common source region 102 may be then formed in the substrate 100. The common source region 102 may be formed by an ion implantation using the patterned insulating layers 112, 114, and 119 and the patterned sacrificial layers 113, 115, and 117 as a mask. The common source region 102 may be formed in the substrate 100 between the preliminary stacked-gate structures. A portion of the common source region 102 may be overlapped with the preliminary stacked-gate structures by diffusing the dopants of the common source region 102.

Figure 2C:
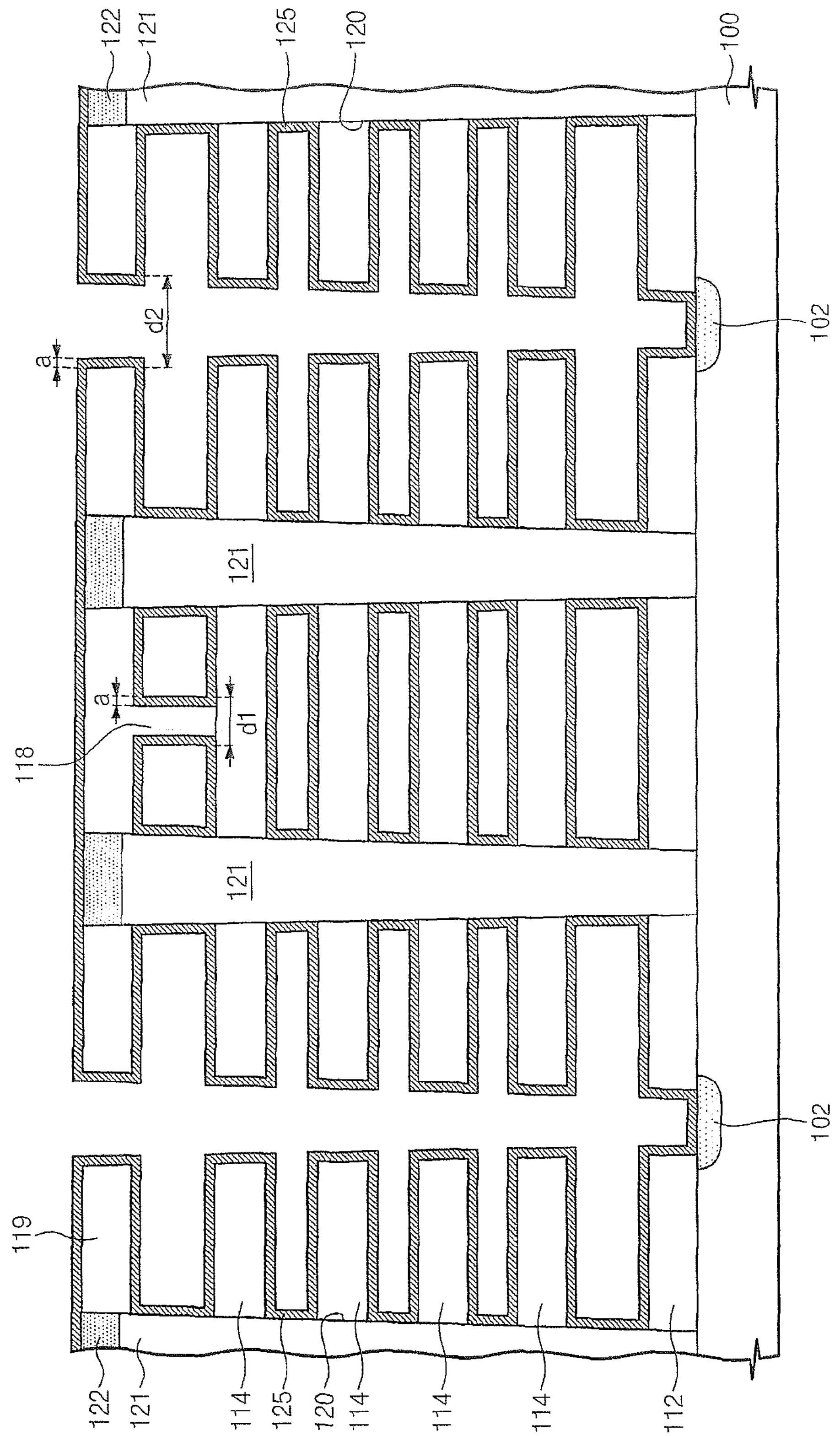

Referring to FIG. 2C, the sacrificial layers 113, 115 and 117 exposed through the groove 123 are removed. The sacrificial layers 113, 115 and 117 may be removed by an isotropic etching process using enchant. For this reason, empty spaces may be formed between the insulating layers 112, 114, and 119.

The gate dielectric pattern 125 may be formed in the groove 123 and the empty spaces. The gate dielectric pattern 125 may conformally cover inner sidewalls of the groove 123 and the empty spaces with a thickness "a". The gate dielectric pattern 125 may further be formed on the upper surfaces of the active patterns 121 and the upper insulating layers 119. The gate dielectric pattern 125 may include at least one of an oxide layer, a nitride layer, and an oxynitride layer. For instance, the gate dielectric pattern 125 may be a multilayer structure composed of oxide layer-nitride layer-oxynitride layer.

Figure 2D:
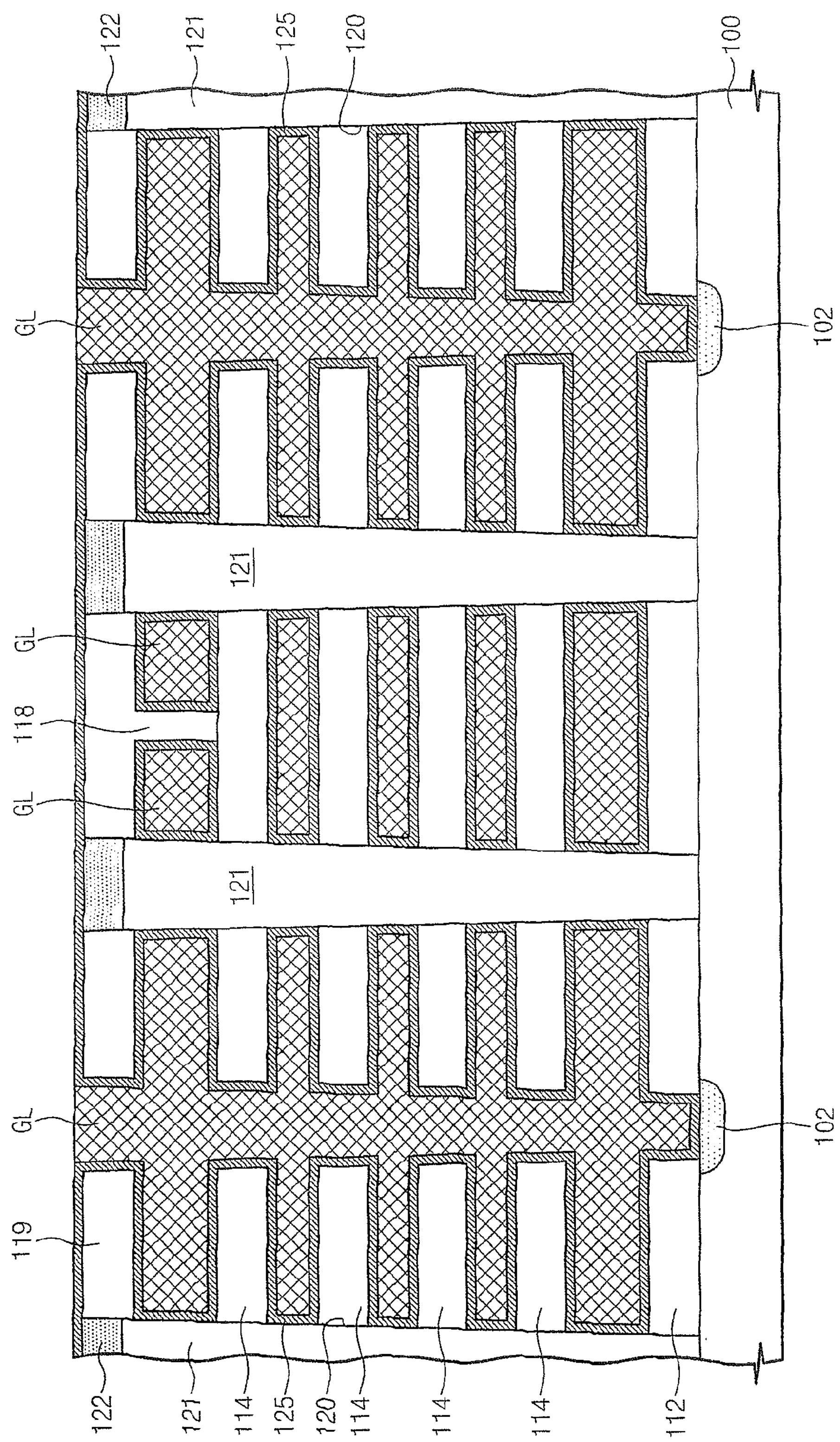

Referring to FIG. 2D, a gate layer GL may be formed to fill the groove 123 and the empty spaces. The gate layer GL may contain at least one of doped semiconductor materials and conductive materials including metals and metal compounds.

In order for the gate layer GL to sufficiently fill the groove 123 and the empty space, the groove 123 may have a width sufficient to fill the gate layer GL. Therefore, there is a limit to the achievement of highly integrated device due to the area of groove in a case of forming the cell strings separated by the groove. According to the embodiments of the present inventive concept, however, the separated cell strings may be formed by separating the upper selection gate pattern. Accordingly, the number of grooves may be reduced. As a result, it is possible to achieve the semiconductor device advantageous to the high integration.

Figure 2E:
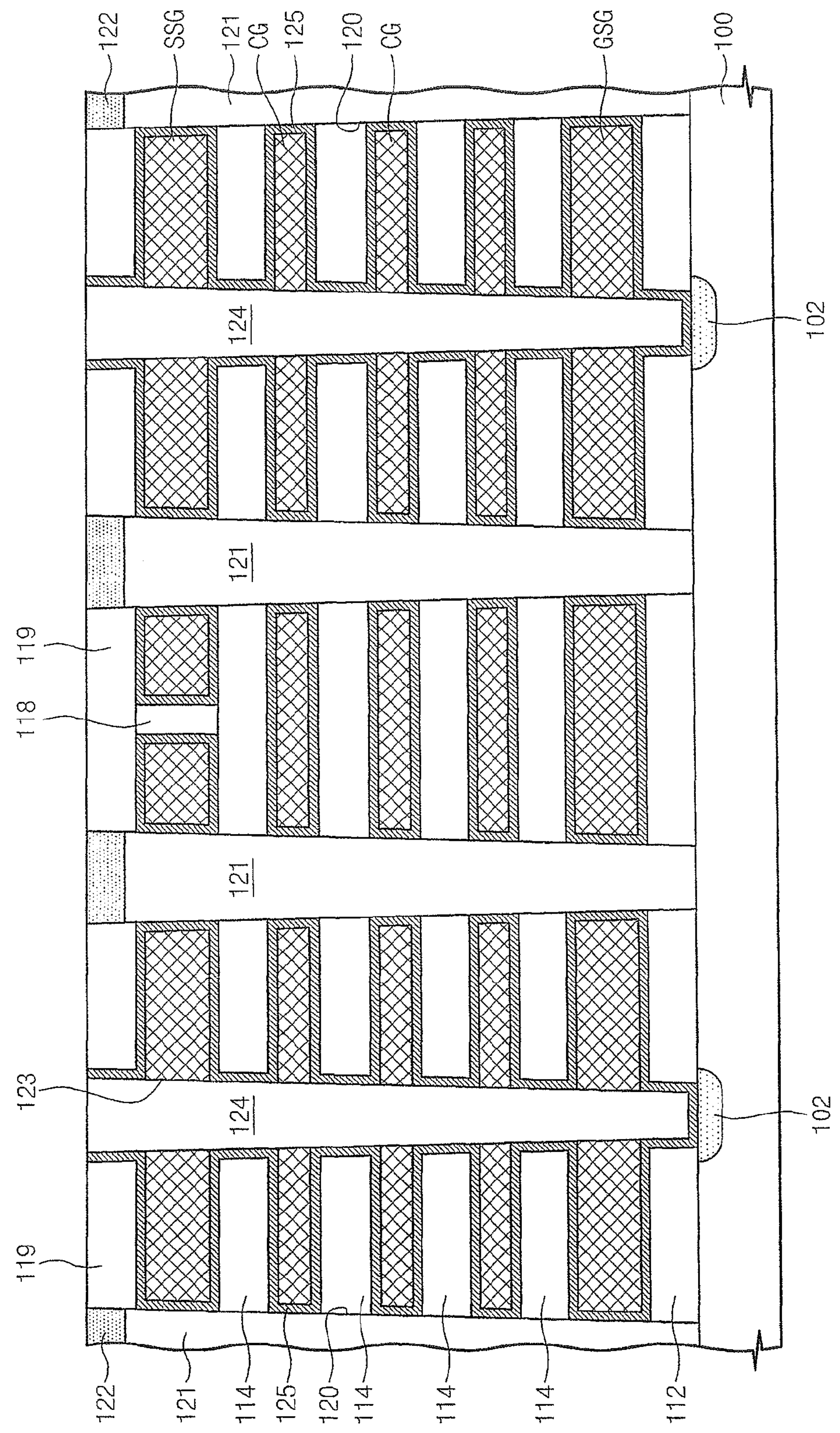
Figure 2F:
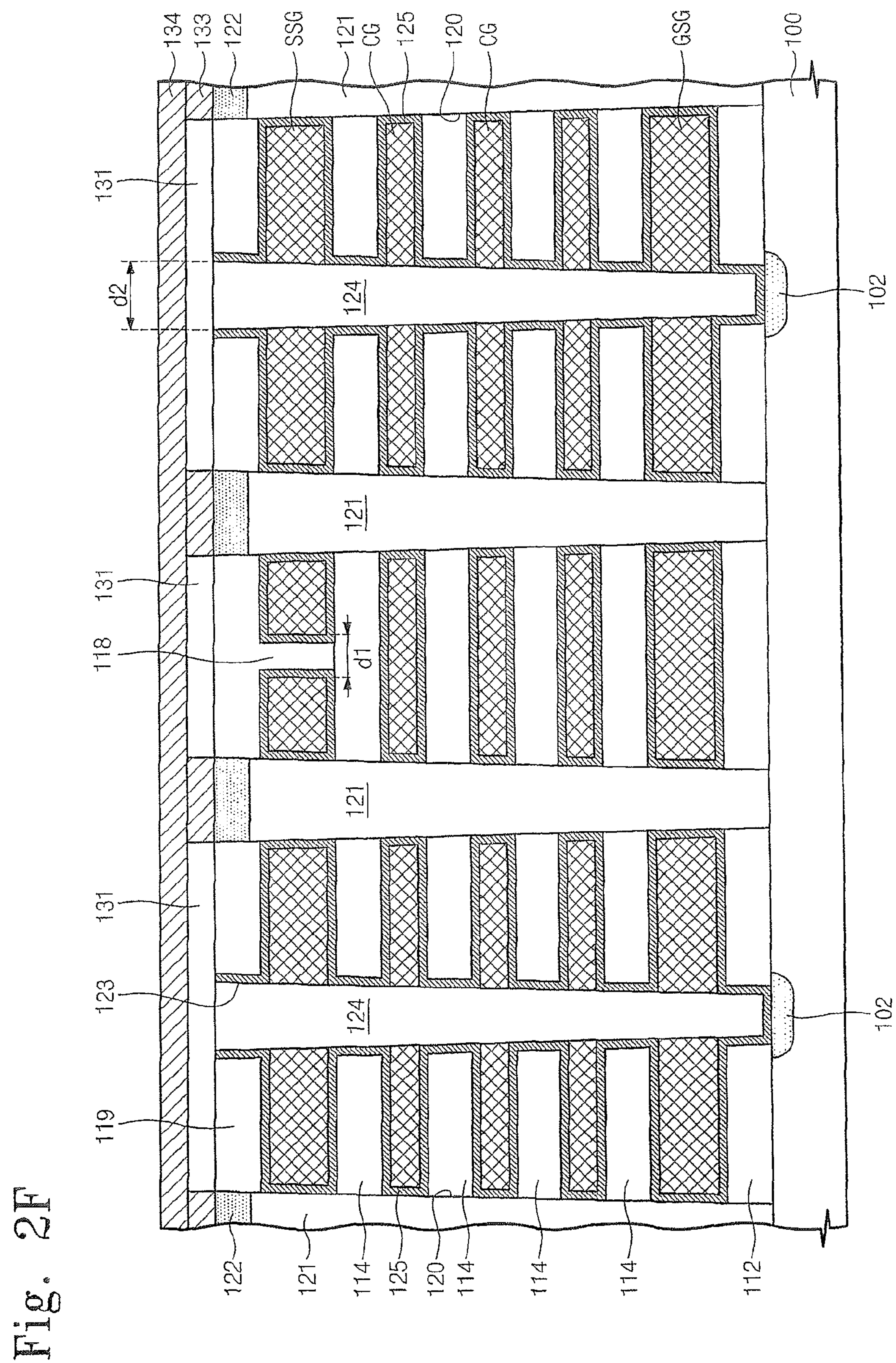

Referring to FIG. 2E, the upper surfaces of the active patterns 121 and the upper surface of the upper insulating layer 119 may be exposed by removing the gate dielectric pattern 125 and the gate layer GL formed on the active patterns 121 and the upper insulating layer 119. The gate dielectric pattern 125 and the gate layer GL may be removed by Chemical Mechanical Polishing (CMP).

The gate patterns GSG, CG, and SSG may be formed by etching the gate layer GL formed in the groove 123. Out of the gate patterns GSG, CG, and SSG, the gate pattern GSG closest to the substrate 100 may be the lower selection gate pattern, and the gate pattern SSG furthest from the substrate 100 may be the upper selection gate pattern. The patterns CGs between the lower selection gate pattern GSG and the upper selection gate pattern SSG may be the cell gate patterns CGs. The gate patterns GSG, CG, and SSG may be the gate layer GL remaining in the empty spaces. A mask covering the upper insulating layer 129 and the active patterns may be formed, and the gate layer GL formed in the groove 123 may then be removed by an anisotropic etching using the mask as an etching mask. After the anisotropic etching, an isotropic etching may further be performed on the gate layer GL. The isotropic etching may be a process for removing the gate layer GL which remains on the sidewalls of the insulating layers formed between the empty spaces. By the isotropic etching, the gate patterns GSG, CG, and SSG formed in the empty spaces may completely be separated.

The inter-gate structure insulating pattern 124 may be formed in the groove 123 where the gate layer GL is removed.

Referring to FIG. 2F, an interlayer insulating layer 131 may be formed on the active patterns 121. A contact hole may be formed in the interlayer insulating layer 131 to expose the dopant region 122. A bitline contact 133, which is electrically connected to the dopant region 122, may be formed in the contact hole. The bitline contact 133 may fill the contact hole. A conductive layer may formed on the interlayer insulating layer 131 and the bitline contact 133. Subsequently, a bitline 134 is formed by patterning the conductive layer. The bitline 134 may be in a line form extending in the second direction. The bitline 134 may be electrically connected to the dopant region 122 through the bitline contact 133.

Another example of a method of forming the semiconductor device according to one embodiment of the present inventive concept will now be described with reference to FIGS. 1 and 3A through 3E. FIGS. 3A through 3E are sectional views of the semiconductor device taken along the line I-I' illustrated in FIG. 1. In FIGS. 3A through 3E, the same reference numerals can be denoted to the same component as in FIGS. 2A through 2F. Hereinafter, the method of forming the semiconductor device will be described based on components and processes different from those of FIGS. 2A through 2F.

Referring to FIG. 3A, the insulating layers 112 and 114 and the sacrificial layers 113, 115, and 117 may be alternately formed on the substrate 100. Unlike the method of forming the semiconductor device described with reference to FIG. 2A, this embodiment of the present inventive concept may not comprise performing the process for separating the uppermost sacrificial layer 117.

Referring to FIG. 3B, the active patterns 121 are formed to penetrate the insulating layers 112 and 114 and the sacrificial layers 113, 115, and 117. The dopant region 122 may be formed in the uppermost part of the active pattern 121. Then, the preliminary stacked-gate structures may be formed by patterning the insulating layers 112, 114, and 119 and the sacrificial layers 113, 115, and 117. The grooves 123 exists between the preliminary stacked-gate structures. The grooves 123 may be empty spaces extending in the first direction between the preliminary stacked-gate structures. The common source regions 102 may be formed in the substrate 100 between the preliminary stacked-gate structures.

Referring to FIG. 3C, the sacrificial layers 113, 115, and 117 may be removed. The gate insulating layer 125 and the gate patterns GSG, CG, and SSGa may be formed in empty spaces provided by removing the sacrificial layers 113, 115, and 117. The gate pattern, that is, the upper selection gate pattern SSGa, formed at the uppermost sacrificial layer 117 may exist in single preliminary stacked-gate structure with a single layer, unlike FIG. 2C.

Referring to FIG. 3D, the upper selection gate pattern SSGa may be separated. The upper selection gate pattern SSGa may be separated by the anisotropic etching. The sidewall of the upper selection gate pattern SSGa may be inclined less than the sidewalls of the preliminary stacked-gate structures from the substrate 100. This is because the thickness of the upper selection gate pattern SSGa is thinner than the thicknesses of the preliminary stacked-gate structures. As a result, the processing margin required for separating the upper selection gate pattern SSGa may be smaller than the space required for forming the preliminary stacked-gate structures. Therefore, it is possible to achieve the semiconductor device optimized for high integration.

The pair of upper selection gate patterns SSGa may be separated in the form of a line extending along the first direction. An inter-upper selection gate insulating pattern 128 is formed to fill the gap between the pair of upper selection gate patterns SSGa. The inter-upper selection gate insulating pattern 128 may come in contact with the opposing sidewalls of the pair of upper selection gate patterns SSGa.

Referring to FIG. 3E, the bitline 134 and the bitline contact 133 may be formed on the active pattern 121. The active pattern 121 may be connected to the bitline 134 through the bitline contact 133.

A method of forming a semiconductor device according to further another embodiment of the present inventive concept will now be described with reference to FIGS. 4A and 4B.

Figure 4A:
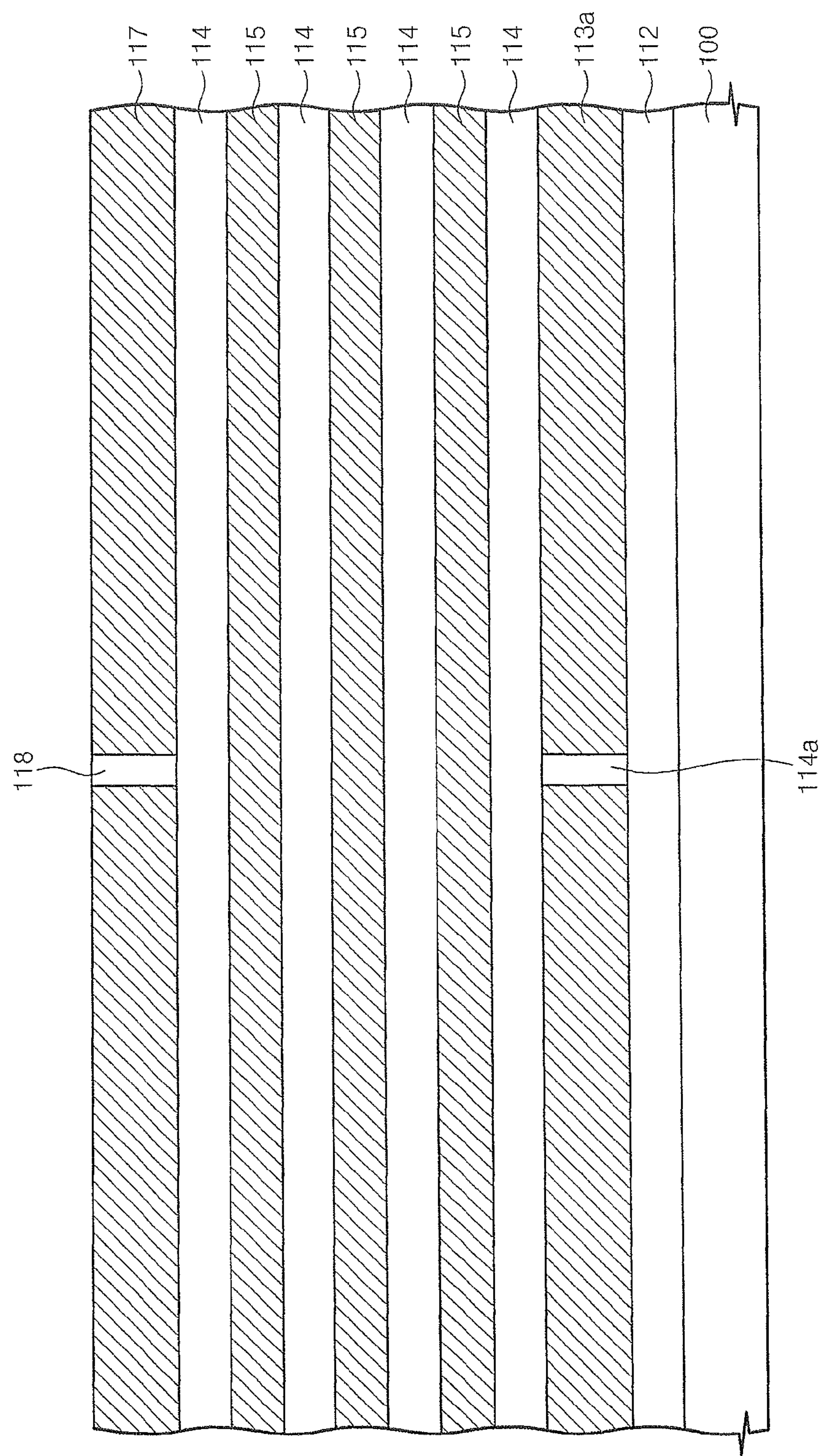
FIGS. 4A and 4B are sectional views illustrating a method of forming a semiconductor device according to another embodiment of the inventive concept.
Figure 4B:
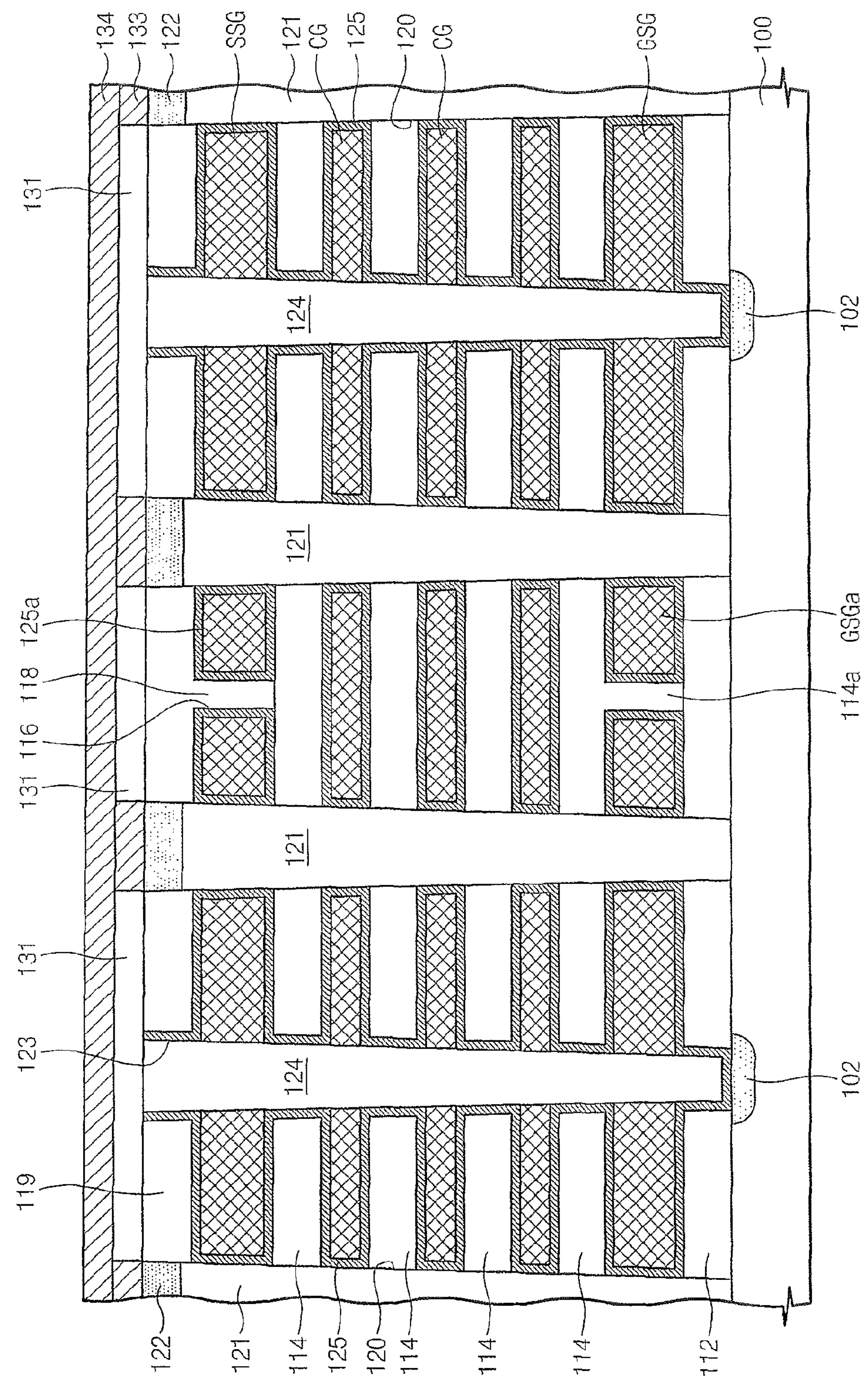

Referring to FIG. 4A, a lowermost sacrificial layer **113*a* is formed so as to be separated into each other, unlike FIG. 2A. The sacrificial layer 113*a* may be separated in the first direction. As illustrated in FIG. 4A, the insulating layer 112 and the sacrificial layers 113*a*, 115 and 117 are formed on the substrate, and the lowest sacrificial layers may then be anisotropically etched. An inter-lower selection gate insulating pattern 114*a* may be formed between the separated sacrificial layers 113*a*. Subsequently, the insulating layers 114 and the sacrificial layers 115 and 117 may alternately be stacked on the separated sacrificial layer 113*a*. Then, the semiconductor device illustrated in FIG. 4B may be formed in a manner similar to that described with reference to FIGS. 2A through 2**F.

The semiconductor devices according to the above-described first and second embodiments may be realized in various types of semiconductor packages. For example, the semiconductor memory devices according to the embodiment of the inventive concept may be packaged in such ways as Package on Package (PoP), Ball grid array (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat Pack (TQFP), Small Outline (SOIC), Shrink Small-Outline Package (SSOP), Thin Small-Outline (TSOP), Thin Quad Flat Pack (TQFP), System In Package (SIP), Multi Chip Package (MCP), Wafer-level Fabricated Package (WFP), or Wafer-level Processed Stack Package (WSP). A package mounted with the semiconductor memory device according to the embodiments of the inventive concept may further include a controller and/or a logic device for controlling the semiconductor memory device.

Figure 5:
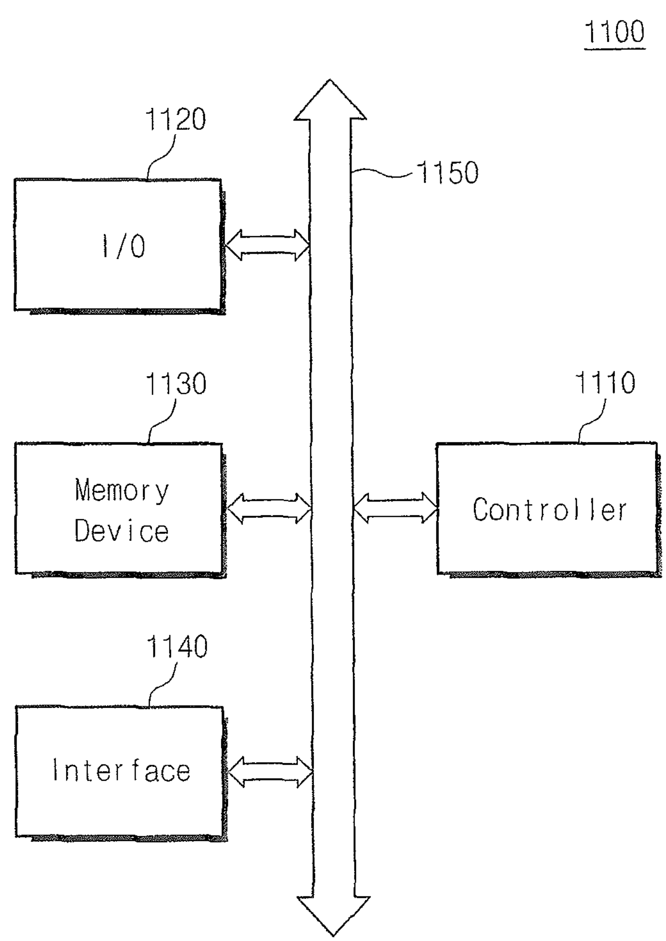
FIG. 5 is a block diagram of an electronic system including the semiconductor devices according to the embodiments of the present inventive concept.

FIG. 5 is a block diagram illustrating an electronic system including the semiconductor device according to embodiments of the inventive concept.

Referring to FIG. 5, an electronic system 1100 according to the embodiment of the inventive concept may include a controller 1110, an input/output device (I/O) 1120, a memory device 1130, an interface 1140, and a bus 1150. The controller 1110, the input/output device (I/O) 1120, the memory device 1130, and/or the interface 1140 may be connected to each other through the bus 1150. The bus 1150 corresponds to a transfer path of data.

The controller 1110 includes at least one of a microprocessor, a digital signal processor, a microcontroller, and logic devices executing similar functions thereof. The I/O device 1120 may include a key pad, a keyboard, or a display device. The memory device 1130 may store data and/or commands, and the like. The memory device 1130 may include at least one of the semiconductor memory devices disclosed in the above-described first and second embodiments of the inventive concept. The memory device 1130 may further include another type of semiconductor memory device (for example, flash memory device, DRAM device, and/or SRAM device). The interface 1140 executes a function of transmitting data to a communication network or receiving data from a communication network. The interface 1140 may be realized in a wireless or wired form. For example, the interface 1140 may include an antenna or a wireless/wired transceiver. The electronic system 1100 may further include a high-speed DRAM and/or a high-speed SRAM as an operational memory for improving the operation of the controller 1110.

The electronic system 1100 is applicable to a personal digital assistant (PDA), a portable computer, a web tablet, a wireless phone, a mobile phone, a digital music player, a memory card, or any electronic device capable of transmitting and/or receiving information in a wireless environment.

Figure 6:
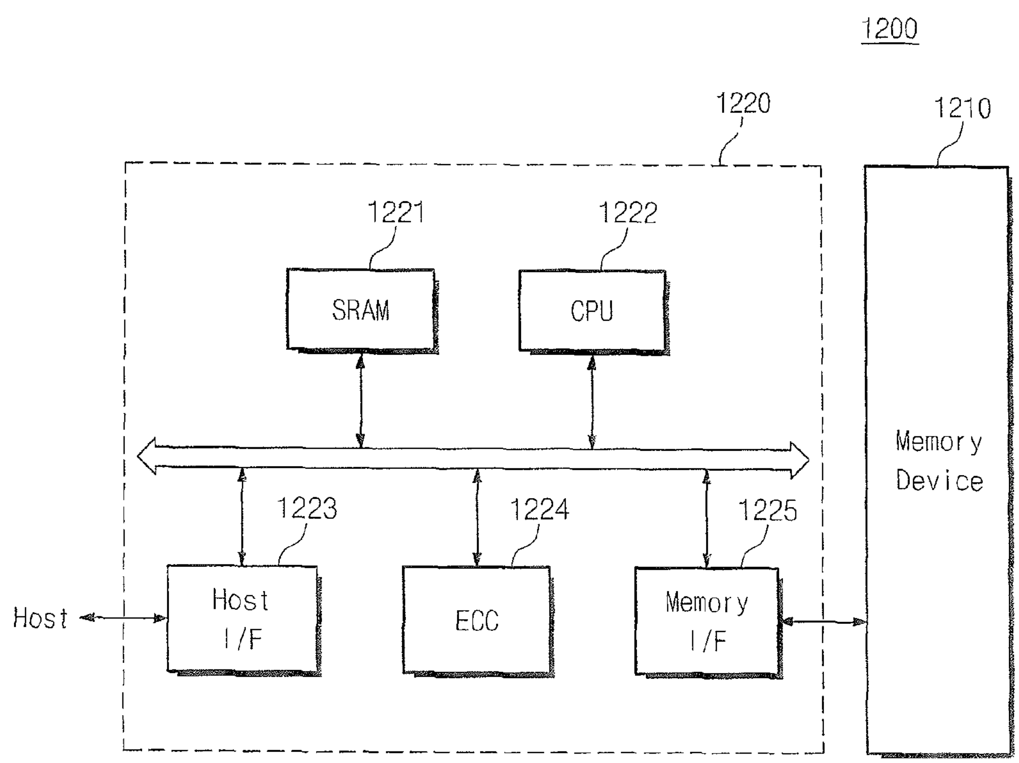
FIG. 6 is a block diagram illustrating a memory card including the semiconductor device according to one embodiment of the present inventive concept.

FIG. 6 is a block diagram illustrating a memory card including the semiconductor device according to one embodiment of the inventive concept.

Referring to FIG. 6, a memory card 1200 according to one embodiment of the inventive concept includes a memory device 1210. The memory device 1210 may include at least one of the semiconductor memory devices disclosed in the above-described first and second embodiments of the present inventive concept. The memory device 1210 may further include another type of semiconductor memory device (for example, flash memory device, DRAM device, and/or SRAM device). The memory card 1200 may include a memory controller 1220 controlling data exchange between a host and the memory device 1210.

The memory controller 1220 may include a processing unit 1222 generally controlling the memory card. The memory controller 1220 may include an SRAM 1221 used as an operational memory of the processing unit 1222. The memory controller 1220 may further include a host interface 1223 and a memory interface 1225. The host interface 1223 may have a protocol for exchanging data between the memory card 1200 and a host. The memory interface 1225 may connect the memory controller 1220 to the memory device 1210. The memory controller 1220 may further include an error correction coding block (Ecc) 1224. The error correction coding block 1224 may detect and correct an error of data read from the memory device 1210. Even though not illustrated, the memory card 1200 may further include a ROM device storing code data used to interface a host. The memory card 1200 may be used as a portable data storing card. Alternatively, the memory card 1200 may be realized as a solid state disk (SSD) replacing a hard disk drive of a computer system.

According to the embodiments of the inventive concept, the active patterns adjacent to each other in the first and second directions may share the cell gate patterns, in one stacked-gate structure. Therefore, it is possible to obtain the semiconductor device optimized for the high integration.

The above-described subject matter is to be considered illustrative and not restrictive, and the appended claims are intended to cover all modifications, enhancements, and other embodiments, which fall within the true spirit and scope of the inventive concept, which is to be determined by the broadest permissible interpretation of the following claims and their equivalents, and shall not be restricted or limited by the foregoing detailed description.

What is claimed is:

1. A semiconductor device comprising:

a stacked-gate structure including a plurality of cell gate patterns and insulating patterns alternately and vertically stacked on a semiconductor substrate and extending in a first direction;

active patterns penetrating the stacked-gate structure and being spaced apart from each other in a second direction intersecting the first direction; and gate dielectric patterns interposed between the cell gate patterns and the active patterns and extending onto upper and lower surfaces of the cell gate patterns, wherein the active patterns share the cell gate patterns in the stacked-gate structure, and wherein, from among the active patterns, an upper width of an active pattern distal from the substrate is greater than a lower width of an active pattern at the substrate.

2. The semiconductor device of claim 1, wherein:

the stacked-gate structure includes a pair of upper selection gate patterns extending in the first direction on an uppermost cell gate pattern, and the pair of upper selection gate patterns is disposed so as to be spaced apart from each other in the second direction.

3. The semiconductor device of claim 2, wherein:

one of the active patterns penetrates one of the pair of upper selection gate patterns in the second direction.

4. The semiconductor device of claim 3, wherein a plurality of the active patterns are arranged along the first direction in the one upper selection gate pattern.

5. The semiconductor device of claim 2, wherein:

the stacked-gate structure further includes a pair of lower selection gate patterns extending in the first direction between a lowermost cell gate pattern and the semiconductor substrate, and the pair of lower selection gate patterns is disposed so as to be spaced apart from each other in the second direction.

6. The semiconductor device of claim 2, further comprising another stacked-gate structure spaced apart from the stacked-gate structure in the second direction, wherein an interval between the pair of upper selection gate patterns in one stacked gate structure is narrower than an interval between the stacked-gate structures.

7. The semiconductor device of claim 6, further comprising common source regions in the substrate between the stacked-gate structures.

8. The semiconductor device of claim 2, wherein the gate dielectric patterns extend onto opposing sidewalls of the pair of upper selection gate patterns.

9. A semiconductor device comprising:

a stacked-gate structure including a plurality of cell gate patterns and insulating patterns alternately and vertically stacked on a semiconductor substrate and extending in a first direction;

active patterns penetrating the stacked-gate structure and being spaced apart from each other in a second direction intersecting the first direction; and gate dielectric patterns interposed between the cell gate patterns and the active patterns and extending onto upper and lower surfaces of the cell gate patterns, wherein:

the active patterns share the cell gate patterns in the stacked-gate structure, the stacked-gate structure includes a pair of upper selection gate patterns extending in the first direction on an uppermost cell gate pattern, the pair of upper selection gate patterns is disposed so as to be spaced apart from each other in the second direction, and sidewalls of the stacked-gate structure make an angle larger than 0° with a normal line of an upper surface of the substrate.

10. The semiconductor device of claim 9, wherein an angle between the sidewalls of the pair of upper selection gate patterns and the normal line of the upper surface of the substrate is smaller than that between the sidewalls of the stacked-gate structure and the normal line of the upper surface of the substrate.

11. The semiconductor device of claim 1, wherein the gate dielectric patterns include an oxide layer-nitride-layer-oxynitride layer.

12. The semiconductor device of claim 9, wherein, from among the active patterns, an upper width of an active pattern distal from the substrate is greater than a lower width of an active pattern at the substrate.

13. A semiconductor device, comprising:

a stacked-gate structure including a plurality of cell gate patterns and insulating patterns alternately and vertically stacked on a semiconductor substrate and extending in a first direction;

active patterns penetrating the stacked-gate structure and being spaced apart from each other in a second direction intersecting the first direction; and gate dielectric patterns interposed between the cell gate patterns and the active patterns and extending onto upper and lower surfaces of the cell gate patterns, wherein the active patterns share the cell gate patterns in the stacked-gate structure, and wherein a width of the cell gate patterns is greater than at least twice a width of the active patterns, in the second direction.

14. The semiconductor device of claim 9, wherein:

one of the active patterns penetrates one of the pair of upper selection gate patterns in the second direction.

15. The semiconductor device of claim 9, wherein a plurality of the active patterns is arranged along the first direction in the one upper selection gate pattern.

16. The semiconductor device of claim 9, wherein:

the stacked-gate structure further includes a pair of lower selection gate patterns extending in the first direction between a lowermost cell gate pattern and the semiconductor substrate, and the pair of lower selection gate patterns is disposed so as to be spaced apart from each other in the second direction.

17. The semiconductor device of claim 9, further comprising another stacked-gate structure spaced apart from the stacked-gate structure in the second direction, wherein an interval between the pair of upper selection gate patterns in one stacked gate structure is narrower than an interval between the stacked-gate structures.

18. The semiconductor device of claim 9, further comprising common source regions in the substrate between the stacked-gate structures.

19. The semiconductor device of claim 9, wherein the gate dielectric patterns extend onto opposing sidewalls of the pair of upper selection gate patterns.

20. The semiconductor device of claim 13, wherein a plurality of the active patterns is arranged along the first direction in the one upper selection gate pattern.

* * * * *